United States Patent [19]

Hongu et al.

[11] 4,238,771
[45] Dec. 9, 1980

[54] MUTING CIRCUIT

[75] Inventors: Masayuki Hongu, Komae; Hiromi Kawakami, Yokohama; Shigeru Ohmuro; Masaharu Tokuhara, both of Tokyo, all of Japan

[73] Assignee: Sony Corporation, Tokyo, Japan

[21] Appl. No.: 886,427

[22] Filed: Mar. 14, 1978

[30] Foreign Application Priority Data

Mar. 16, 1977 [JP] Japan .................. 52/28979

[51] Int. Cl.² .............................................. H04N 5/60
[52] U.S. Cl. .................................. 358/165; 455/234
[58] Field of Search ................ 358/165, 198; 325/478, 325/456, 402, 403, 348

[56] References Cited

U.S. PATENT DOCUMENTS

| | | | |
|---|---|---|---|
| 2,904,678 | 9/1959 | Malchow | 325/478 |
| 3,686,430 | 8/1972 | Parker | 358/165 |
| 3,873,925 | 3/1975 | Eastmond | 325/478 |
| 3,939,425 | 2/1976 | Toyoshima | 325/478 |
| 3,979,679 | 9/1976 | Bush et al. | 325/478 |
| 4,095,191 | 6/1978 | Shibuya | 325/456 |
| 4,117,406 | 9/1978 | Takahashi et al. | 325/478 |

*Primary Examiner*—Robert L. Griffin
*Assistant Examiner*—Joseph A. Orsino, Jr.
*Attorney, Agent, or Firm*—Lewis H. Eslinger; Alvin Sinderbrand

[57] ABSTRACT

A muting circuit for a television or AM signal receiver which uses a synchronous detector.

The muting circuit includes an input terminal for receiving an amplitude modulated signal, a synchronous detector for detecting such AM signal, a circuit for supplying a reference signal having a predetermined frequency and phase to the synchronous detector, an amplifier, a circuit path for delivering to the amplifier the detected signal produced by the synchronous detector, a level detecting device connected to the output of the synchronous detector for producing an excess signal when the detected signal exceeds a predetermined level, an integrator for producing a muting signal in response to the production over an extended period of time of the excess signal, and a switching device connected to the amplifier for muting the signal produced by the amplifier in response to the production of the muting signal.

11 Claims, 6 Drawing Figures

MUTING CIRCUIT

BACKGROUND OF THE INVENTION

1. Field of the Invention

This invention relates to muting circuits for amplitude modulated signal receivers.

2. Description of the Prior Art

It is known in the art that a synchronous detector has a low distortion characteristic as compared with a conventional envelope detector, such as a diode detector.

However, there is a disadvantage in the synchronous detector, that is, an undesirable beat signal is generated by the synchronous detector when the frequency phase of its reference signal input does not coincide with that of its AM signal signal input. If this beat signal is supplied to a speaker through an audio amplifier, an unpleasant sound is produced.

OBJECTS AND SUMMARY OF THE INVENTION

Accordingly, it is an object of this invention to provide a muting circuit for use with an amplitude modulated signal receiver having a synchronous detector that avoids the above-described difficulty.

More particularly, it is an object of this invention to provide a muting circuit that prevents an unpleasant sound from being produced when a beat signal is generated by a synchronous detector used to detect amplitude modulated signals.

Another object of this invention is to provide a muting circuit that mutes the audio signal when a beat signal is generated by a synchronous detector, but which does not cause the audio signal to be muted by the mere occurrence of occasional random noise in the detected signal.

Yet another object of the invention is to provide a muting circuit for use in a television receiver that uses a synchronous detector, which muting circuit, when a beat signal is generated by the synchronous detector, will stop the reproduction of the audio signal and will suppress the White noise in the video image but, nevertheless, will not stop the reproduction of the video image.

In accordance with an aspect of this invention, a muting circuit for an AM signal receiver is provided with an AM signal input terminal, and a synchronous detector connected to the AM signal input terminal, the synchronous detector having an output terminal at which it produces a detected signal. A reference signal generating circuit is connected to the AM signal input terminal and supplies to the synchronous detector a reference signal having a predetermined frequency and phase. The muting circuit further includes an amplifier, means defining a detected signal path connecting the output terminal to said amplifier, level detecting means connected to the output terminal for producing an excess signal whenever the level of the detected signal exceeds a predetermined level, integrating means connected to the level detecting means for producing a muting signal which integrating means requires the production over an extended period of time of at least one of said excess signals before producing said muting signal, and switching means connected to the amplifier for muting the signal produced by said amplifier in response to the production of said muting signal. In a preferred embodiment, there are two amplifiers, an audio amplifier connected to the above-described switching means and a video amplifier. In such a preferred embodiment second switching means is connected between the detected signal path and a reference potential, which second switching means is also responsive to the production of the excess signal. Unlike the first-mentioned switching means, the second switching means is connected to the audio amplifier and responds substantially instantaneously to the production of the excess signal.

The above, and other objects, features and advantages of the invention, will be apparent in the following detailed description of an illustrative embodiment of the invention which is to be read in connection with the accompanying drawings.

DESCRIPTION OF THE PREFERRED EMBODIMENT

In order to better understand the present invention, a prior art television receiver will first be described.

Synchronous detection is well known in the art of television and AM radio receivers as a means for detecting amplitude modulated signals.

Figure 1:
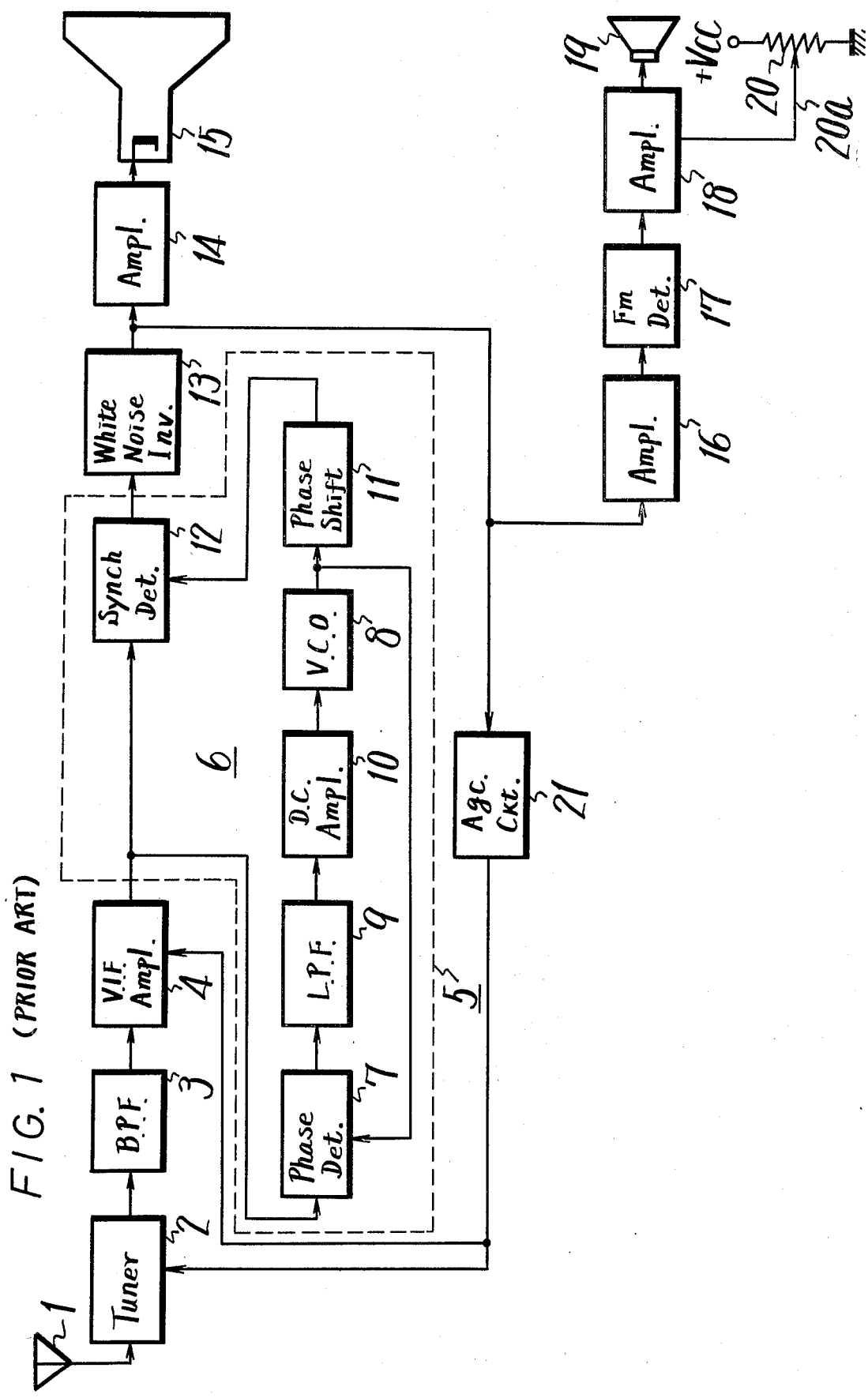
FIG. 1 is a block diagram showing a prior art television receiver provided with a synchronous detector and a white noise inverter.

FIG. 1 is a block diagram of a prior art television receiver in which such synchronous detection is employed. In the example of FIG. 1, a signal received by an antenna 1 is fed to a tuner 2, which then converts the received signal to a video intermediate frequency (VIF) signal. This VIF signal is fed through a band pass filter 3 to a video intermediate frequency (VIF) amplifier 4 to be amplified. The amplified VIF signal is applied to a video detecting circuit 5, which uses a synchronous detector to detect that signal. The video detecting circuit 5 consists of a phase-locked loop (PLL) 6, a phase shifter 11 and a synchronous detector 12. The PLL 6 is formed of a phase detector 7, a voltage controlled oscillator (VCO) 8, a low pass filter 9 and a DC amplifier 10.

The amplified VIF signal from the VIF amplifier 4 is applied to the phase detector 7, where its phase is compared with the output signal from the VCO 8. The signal detected by the phase detector 7 is fed through the low pass filter 9 and the DC amplifier 10 to the VCO 8 to control the oscillation frequency and phase of that VCO. Thus, the VCO 8 produces an output signal which has the same frequency as that of VIF signal, with a phase difference of 90° from the VIF signal. The output signal from the VCO 8 is applied to the phase shifter 11 to be phase-shifted by 90°. Thus, from the phase shifter 11 there is obtained a reference signal for synchronous detection which is same as the VIF signal in frequency and phase. The VIF signal from the VIF amplifier 4 is also fed to the synchronous detector 12 which is supplied with the reference signal from the phase shifter 11. Thus the VIF signal is synchronously detected with the reference signal by the synchronous detector 12 and hence a detected video signal is produced at the output terminal of the synchronous detector 12.

The detected signal from the output terminal of synchronous detector 12 is applied to a white noise inverter 13 (which will be described later) and its white noise components are removed thereby. The output signal from the white noise inverter 13 is then fed through a video amplifier 14 to a cathode ray tube 15. The output signal from the white noise inverter 13 is also fed through a sound intermediate frequency (SIF) amplifier 16 to an FM detector 17 to be sound-detected. The audio signal from the FM detector 17 is fed through a voltage controlled audio amplifier 18 to a speaker 19 to be heard. In this example, there is provided a variable resistor 20 to provide a gain control voltage for adjusting the sound volume of amplifier 18. For example, as the movable contact 20a is moved toward the ground terminal of resistor 20, the gain of the voltage controlled audio amplifier 18 is decreased and the volume of the speaker 19 is decreased correspondingly.

As has been done in the prior art, the detected signal passed through the white noise inverter 13 is further fed to an AGC circuit 21, whose output signal is applied to the tuner 2 and the VIF amplifier 4 as their AGC signal.

Now, the operation of the white noise inverter 13 will be described with reference to FIGS. 2A and 2B.

Figure 2A:
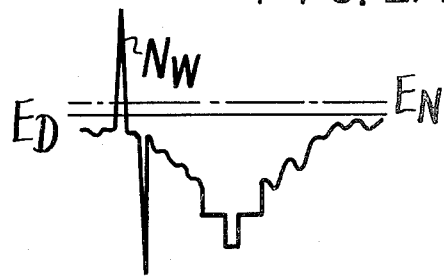
FIGS. 2A and 2B and FIGS. 3A and 3B are waveform charts used for explaning the operation of the television receiver shown in FIG. 1.
Figure 2B:
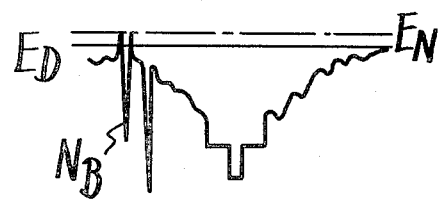

From the video detecting circuit 5 there is developed a detected video signal which has a predetermined polarity as shown in FIG. 2A (in this example, negative polarity). In FIG. 2A, $E_D$ represents the DC voltage level upon no signal. In this case, there may appear a noise $N_W$ at the white side of the possible voltage range of the detected signal which will cause a conspicuous white spot on the picture of the cathode ray tube 15. The above white noise inverter 13 functions to remove such white noise $N_W$ from the detected video signal. When such a white noise $N_W$ exceeds a predetermined constant voltage level $E_N$ some what on the white side of the DC level $E_D$, the white noise inverter 13 operates to make that white noise $N_W$ into a noise $N_B$ inverted to the black side of the voltage range, as shown in FIG. 2B. The resultant black noise $N_B$ will be much less conspicuous on the picture screen than would the white noise $N_W$ which it replaces.

In the case in which the VIF signal is synchronously detected by utilizing the PLL 6 to provide the reference signal, if the PLL 6 gets out of phase with the VIF signal, such as when the channel is changed or a fine tuning knob is rotated greatly, a beat component appears in the synchronously detected signal and hence a conspicuous buzz is produced from the speaker 19.

An example of the muting circuit according to the present invention will now be described which mutes the sound signal when the PLL gets out of phase with the VIF signal and causes a beat component to appear in the detected video signal.

Figure 3A:
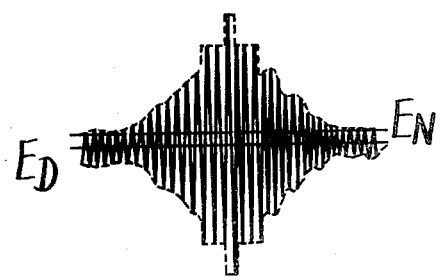

The beat components which appear in the detected signal when the PLL gets out of phase with the VIF signal are as shown in FIG. 3A. The voltages of these beat components vary equally far on the white side of the DC voltage level $E_D$, which occurs when there is no signal, as they do on the black side. The present invention uses this phenomenon to mute the audio output when the voltage of the detected signal exceeds a predetermined constant level and hence prevents the buzz sound from being produced from the speaker.

Figure 4:
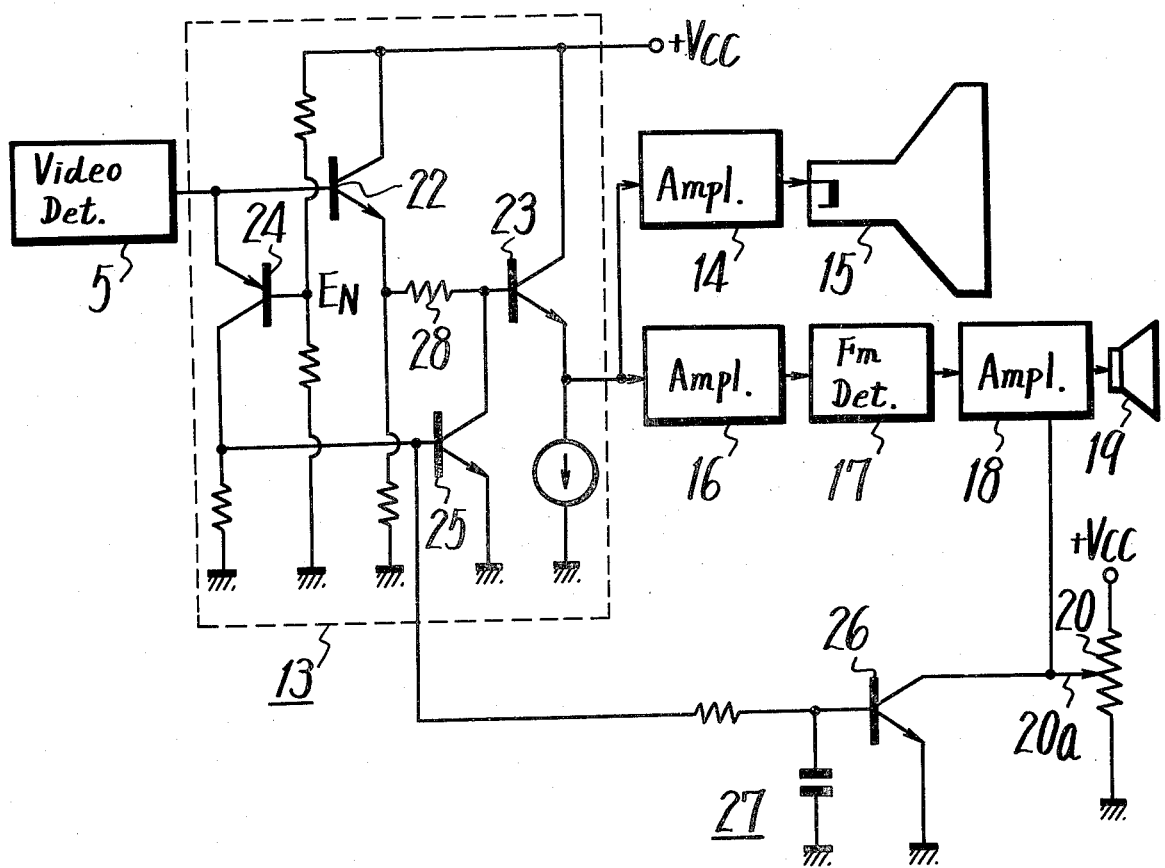
FIG. 4 is a circuit diagram showing an example of muting circuit according to this invention.

FIG. 4 is a connection diagram, partially in block form, showing an example of a muting circuit according to the present invention. In the example of the invention shown in FIG. 4, the detected signal from output terminal of the video detecting circuit 5 is applied to the white noise inverter 13 of this invention. The detected signal from the video detecting circuit 5 is follows a video signal path through the base and emitter of a transistor 22 which is of the emitter follower configuration, through a resistor 28 and through the base and emitter of a transistor 23 which is of the emitter follower configuration to the input terminals of amplifiers 14 and 16. The detected signal from the output terminal of video detector 5 is also fed to the emitter of a level detecting transistor 24. A source of a reference potential, the constant voltage level $E_N$, is connected to the base of the transistor 24. Thus, when the detected signal exceeds the predetermined constant level $E_N$, the transistor 24 is made ON and produces an excess signal, represented by a positive voltage at its collector. This excess signal is applied to the base of a transistor 25 in the white noise inverter 13 to turn the transistor 25 ON. Transistor 25 provides a switching means capable of connecting the path of the detected signal to a ground potential. In this case, due to the presence of the resistor 28, the base voltage of the transistor 23 is lowered, and thus when a white noise $N_W$ exceeds the constant level $E_N$, as is shown in FIG. 2A, it is inverted into the noise $N_B$ at the black side of the voltage range, as shown in FIG. 2B.

Further, in the example of the invention shown in FIG. 4, the movable contact 20a, which constitutes the gain control output terminal of the gain control variable resistor 20, is connected through the collector-emitter path of a transistor 26 to ground potential. The transistor 26 provides a switching means for muting the audio signal produced by amplifier 18. The collector of the level detecting transistor 24 of the white noise inverter 13 is connected through an integrator circuit 27, which comprises a capacitor and a resistor, to the base of the transistor 26. When level detecting transistor 24 produces an excess signal, positive charge is transferred by its collector to the capacitor of the integrator circuit 27. If the PLL 6 gets out of phase with the VIF signal and thus causes the detected signal to repeatedly exceed the voltage level $E_{N1}$ as shown in FIG. 3A, a series of excess signals will be produced. As a result, enough positive change will build up on the integrator circuit 27 to turn transistor 26 ON and thus the gain control output terminal will be grounded and the output of voltage controlled audio amplifier 18 will be muted. The integrator circuit 27 prevents the sound circuit system from being affected by occasional white noise when the PLL is in phase with the VIF signal, and it prevents the amplifier 18 from being turned ON and OFF every time the detected signal exceeds level $E_N$ when the PLL is out of phase with the VIF signal.

Figure 3B:
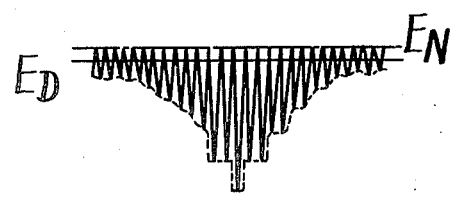

When the PLL 6 gets out of phase with the VIF signal the white noise inverter 13 carries out its inherent function of removing the white noises contained in the detected video signal, including those white noises caused by the beat effect so that the detected signal delivered to the emitter of the transistor 23 becomes as shown in FIG. 3B in which noises at the white side are suppressed below the predetermined constant level $E_N$.

The present invention, as described above, greatly reduces the unpleasant effects that tend to result when the PLL of a receiver which uses a synchronous detector gets out of phase with the signal being detected. The white noise produced by the beat effect when the PLL is out of phase is suppressed, so that the resultant video signal is improved, and the annoying audio signal produced by such beat effect is muted. As a result, the present invention makes the process of tuning a television set much more pleasant.

It will be apparent that the present invention can be applied to an AM radio receiver in which the AM detection is carried out by means of synchronous detection utilizing a PLL. For example, use of an integrator circuit between a level detecting transistor which monitors the detected audio signal and a transistor which controls the voltage controlled audio amplifier, this invention can mute the annoying audio signal produced in such radios when the PLL is out of phase, without requiring that such signal also be muted by the occurrence of random noise.

Having described a specific preferred embodiment of the invention with reference to the accompanying drawings, it is to be understood that the invention is not limited to that precise embodiment, and that various changes and modifications may be effected therein by one skilled in the art without departing from the scope or spirit of the invention as defined in the appended claims.

We claim as our invention:

1. A muting circuit for an AM signal receiver, comprising:
    an AM signal input terminal;
    a synchronous detector having first and second input terminals, said first input terminal being connected to said AM signal input terminal, and said synchronous detector further having an output terminal at which it produces a detected signal of variable amplitude;
    a reference signal generating circuit connected to said second input terminal and supplying to said synchronous detector a reference signal having a predetermined frequency and phase;
    an amplifier;
    means defining a detected signal path connecting said output terminal to said amplifier;
    level detecting means for producing excess signals connected to said output terminal, said level detecting means producing one of said excess signals whenever the amplitude of said detected signal exceeds a predetermined amplitude level that exceeds a desired amplitude range for said detected signal;
    integrating means connected to said level detecting means for producing a muting signal, said integrating means requiring the production over an extended period of time of one or more of said excess signals before producing said muting signal; and
    switching means connected to said amplifier for muting the signal produced by said amplifier in response to the production of said muting signal.

2. A muting circuit for an AM signal receiver, comprising:
    an AM signal input terminal;
    a synchronous detector having first and second input terminals, said first input terminal being connected to said AM signal input terminal, and said synchronous detector further having an output terminal at which it produces a detected signal of variable amplitude;
    a reference signal generating circuit connected to said second input terminal and supplying to said synchronous detector a reference signal having a predetermined frequency and phase;
    an amplifier input terminal;
    means defining a detected signal path connecting said output terminal to said amplifier input terminal;
    level detecting means for producing excess signals connected to said output terminal of said synchronous detector, said level detecting means producing one of said excess signals whenever the amplitude of said detected signal exceeds a predetermined amplitude level;
    first switching means connected to said detected signal path for altering the detected signal that is delivered to said amplifier input terminal in substantially instantaneous response to the production of one of said excess signals;
    an audio amplifier connected to said amplifier input terminal; and
    second switching means connected to said audio amplifier and controlled by the output of said level detecting circuit for muting an audio signal produced by said amplifier in response to the production of one or more of said excess signals over an extended period of time.

3. A muting circuit according to claim 2; wherein said AM signal input terminal is for receiving AM radio signals in which a carrier signal is amplitude modulated by an audio signal.

4. A muting circuit according to claim 2; wherein said AM signal input terminal is for receiving an amplitude modulated component of television signals.

5. A muting circuit according to claim 4; wherein audio information is frequency modulated on a signal which in turn is amplitude modulated on said amplitude modulated component.

6. A muting circuit for a television receiver, comprising:
    a television signal input terminal;
    a synchronous video detector having first and second input terminals, said first input terminal being connected to said television signal input terminal, and said synchronous video detector further having an output terminal at which it produces a detected signal of variable amplitude;
    a reference signal generating circuit connected to said second input terminal and supplying to said synchronous video detector a first reference signal having a predetermined frequency and phase; p1 a video signal amplifier;
    means defining a video signal path connecting said output terminal of said synchronous video detector to said video signal amplifier;
    level detecting means for producing excess signals connected to said output terminal of said synchronous video detector, said level detecting means producing one of said excess signals whenever the amplitude of said detected signal exceeds a predetermined amplitude level; p1 a source of predetermined potential;
    first switching means for selectively connecting said video signal path to said source of predetermined potential substantially instaneously in response to the production of one of said excess signals;
    an audio amplifier connected to said video signal path; and
    second switching means connected to said audio amplifier and controlled by the output of said level detecting circuit for muting the audio signal produced by said audio amplifier, said second switching means requiring the production over an extended period of time of one or more of said excess signals in order to mute said audio signal.

7. A muting circuit according to claim 6, wherein said reference signal generating circuit includes a phase-locked loop.

8. A muting circuit according to claim 7, wherein said phase-locked loop includes a phase detector connected to said television signal input terminal, a low pass filter connected to said phase detector, and a voltage controlled oscillator connected to said low pass filter for supplying a second reference signal to said phase detector.

9. A muting circuit according to claim 6, wherein said audio amplifier is of a voltage controlled type, and further including an additional source of predetermined potential and a gain control voltage generating circuit having a gain control output terminal for supplying a gain control signal to said audio amplifier, and wherein said second switching means is connected between said gain control output terminal and said additional source of predetermined potential.

10. A muting circuit according to claim 9, further comprising integrating means connected between said level detecting means and said second switching means for causing said second switching means to require the production over said extended period of time of one or more of said excess signals before it mutes said audio signal.

11. A muting circuit for a television receiver, comprising:
a television signal input terminal;
a synchronous video detector having first and second input terminals, said first input terminal being connected to said television signal input terminal, and said detector further having an output terminal to provide a detected signal;
a reference signal generating circuit connected to said second input terminal and supplying to said synchronous video detector a first reference signal having a predetermined frequency and phase;
a video signal amplifier;
a video signal supplying line connecting said output terminal of the synchronous video detector to said video signal amplifier and including a series circuit of a first transistor of an emitter follower type and an impedance;
a source of a reference potential;
a level detecting circuit connected to said output terminal of the synchronous video detector, said level detecting circuit including a second transistor having an emitter and a base which are connected to said output terminal of the synchronous video detector and to said source of reference potential, respectively;
a source of predetermined potential;
a first switching circuit connected between said video signal supplying line and said source of predetermined potential and controlled by said level detecting circuit, and first switching circuit including a third transistor having a collector, a base and en emitter which are connected to said video signal supplying line, the collector of said second transistor and said source of predetermined potential, respectively;
an audio amplifier supplied with an output signal from said synchronous video detector, said audio amplifier being of a type which has its gain controlled by a gain control voltage signal;
a gain control voltage signal generating circuit for supplying a gain control voltage signal to said audio amplifier;
a voltage integrating circuit connected to the collector of said second transistor; and
a second switching circuit connected to said audio amplifier and said integrating circuit for muting the audio signal produced by said audio amplifier when the output of said synchronous video detector causes the voltage of said integrating circuit to exceed a predetermined level.

* * * * *